United States Patent [19]

Milcamps et al.

[11] Patent Number: 5,023,743

[45] Date of Patent: Jun. 11, 1991

[54] DEVICE FOR PROTECTING A DELAY-LINE MODULATOR

[75] Inventors: Jacques Milcamps, Clamart; Jean-Louis Pourre, Les Molieres; Jean-Pierre Thiebaut, Orsay, all of France

[73] Assignee: CGR MEV, Buc, France

[21] Appl. No.: 396,637

[22] Filed: Aug. 22, 1989

[30] Foreign Application Priority Data

Aug. 26, 1988 [FR] France .................. 88 11292

[51] Int. Cl.$^5$ .............................................. H02H 3/00
[52] U.S. Cl. .......................................... 361/1; 333/18
[58] Field of Search ............... 361/93, 100, 1; 322/9 R, 68; 333/18; 323/234, 265; 207/92, 99, 103, 106, 108, 109

[56] References Cited

U.S. PATENT DOCUMENTS

| | | | |
|---|---|---|---|
| 3,176,158 | 3/1965 | Guignard . | |
| 3,277,342 | 10/1966 | Ross . | |
| 3,881,145 | 4/1975 | Tanigaki | 320/1 |
| 4,710,699 | 12/1987 | Miyamoto | 361/93 X |

OTHER PUBLICATIONS

IEEE Transactions on Nuclear Science, vol. NS-24, No. 3, Jun. 1977, pp. 1343–1345.

Primary Examiner—Derek S. Jennings
Attorney, Agent, or Firm—Oblon, Spivak, McClelland, Maier & Neustadt

[57] ABSTRACT

A device for protecting delay-line modulators of this type by detecting turn-off of the discharge thyristor by a comparator so as to prevent closing of the charge thyristor as long as the discharge thyristor is in the conducting state. This has the effect of preventing short-circuiting of the feed source.

3 Claims, 2 Drawing Sheets

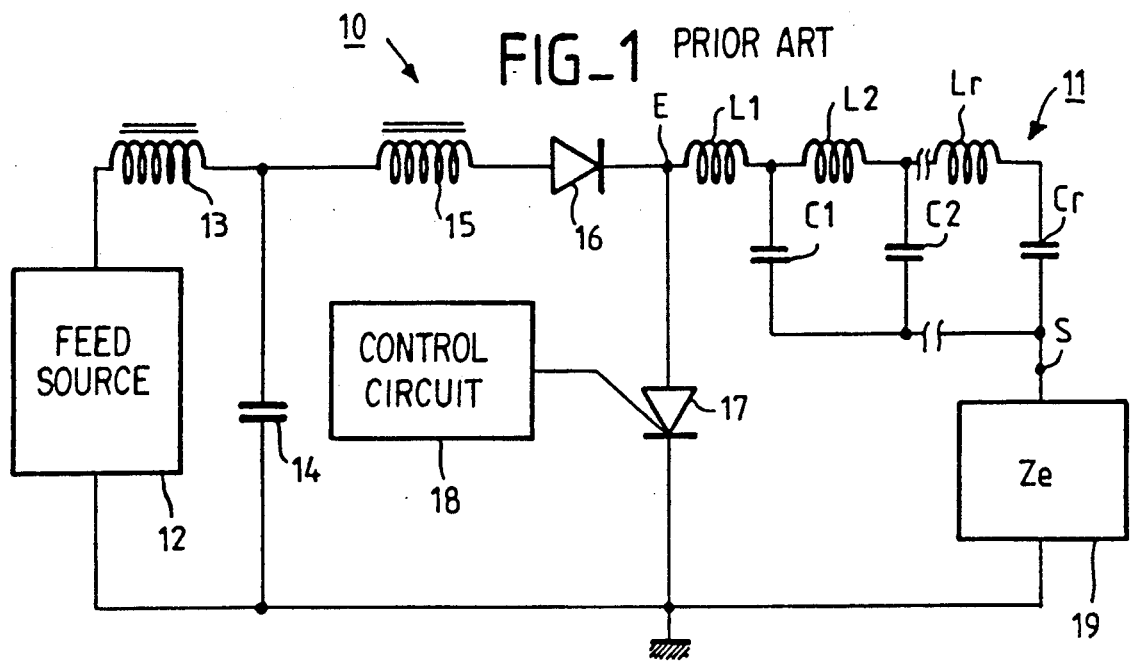
FIG_1 PRIOR ART
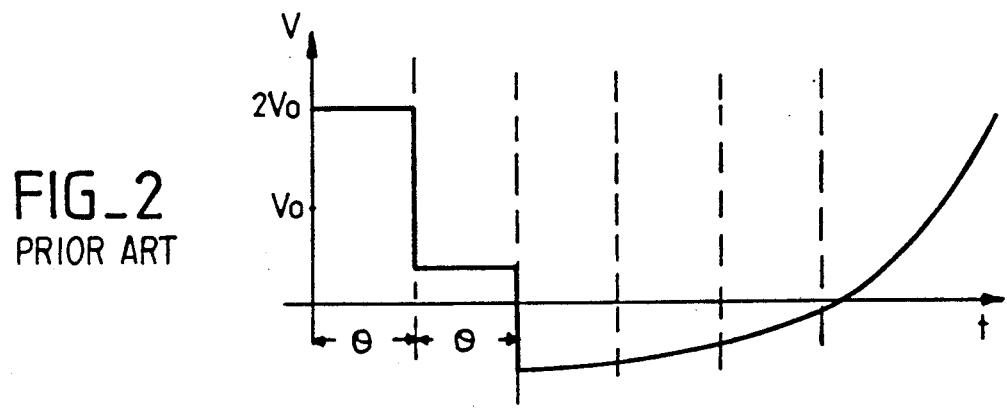
FIG_2 PRIOR ART
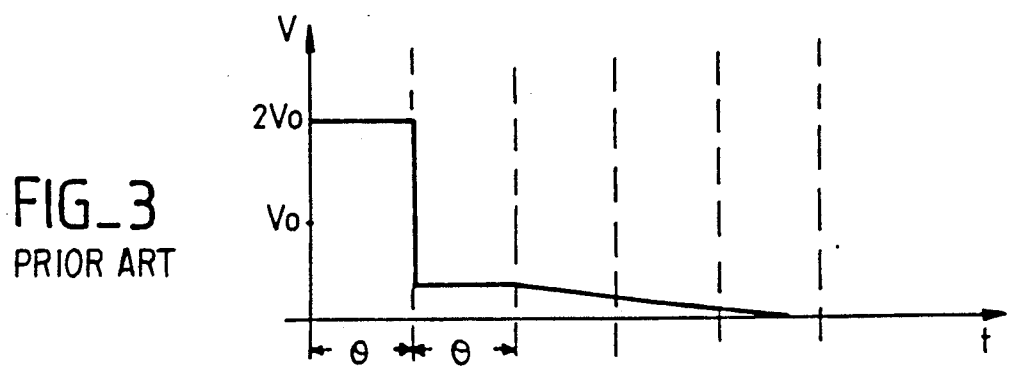
FIG_3 PRIOR ART

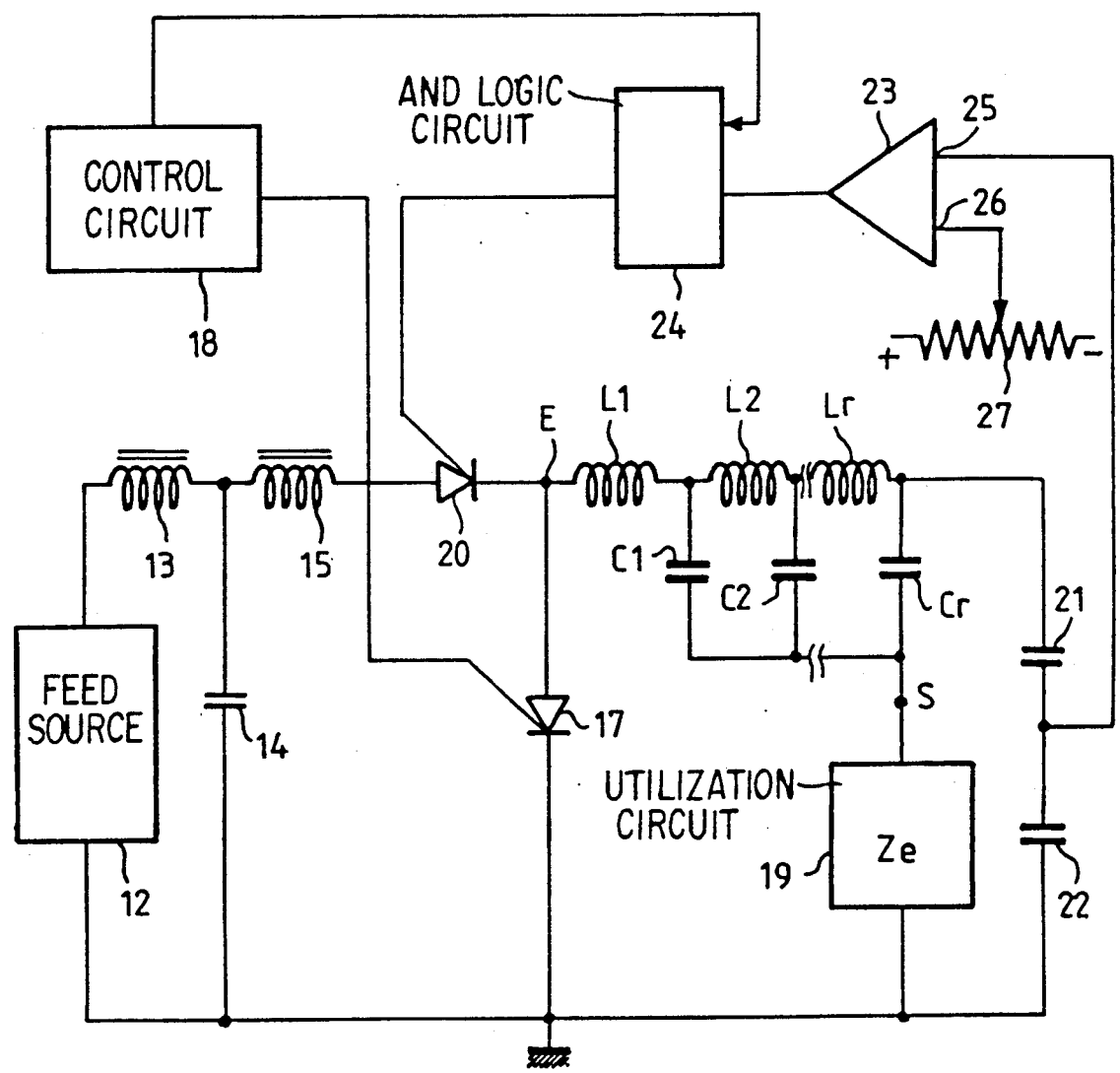
FIG_4

DEVICE FOR PROTECTING A DELAY-LINE MODULATOR

BACKGROUND OF THE INVENTION

1. Field of the Invention

This invention relates to delay-line modulators and more particularly to a device for protecting modulators of this type.

2. Description of the Prior Art

A delay-line modulator is intended to deliver pulses to an impedance which consists in most cases of a vacuum tube such as a klystron, a magnetron, a grid tube.

FIG. 1 is a schematic circuit diagram of a delay-line modulator 10 in accordance with the prior art. This modulator has a delay line 11, the input terminal E of which is connected to a circuit for charging the delay line and a circuit for controlling the discharge of the delay line whilst the output terminal S is connected to the utilization circuit 19 represented schematically by an impedance Ze. The delay line 11 comprises a series of elementary cells constituted by a set of capacitors C1, C2 . . . Cr and coils L1, L2 . . . Lr. The line-charging circuit comprises a direct-current feed source 12, a filtering coil 13, a high-capacitance capacitor 14, a load coil 15 and a diode 16. Discharge of the delay line is produced by a thyristor 17 which is controlled by a control circuit 18. The thyristor 17 can be replaced by a thyratron or, more generally, by a controlled switch.

The operation of the modulator of FIG. 1 is accordingly as follows. Charging of the delay line 11 is carried out by means of the diode 16 whilst the thyristor 17 is not in the conducting state. The delay line is charged and its input terminal E attains after a predetermined time interval a potential in the vicinity of $1V_o$ if $V_o$ is the voltage of the feed source 12. The time-duration T of this charge is given by the formula:

$$T = \pi \sqrt{LC}$$

where
L is the self-inductance of the load coil 15
C is the equivalent capacitance of the capacitors C1, C2 . . . Cr.

At the end of this charging time interval, the thyristor 17 is triggered into conduction by a signal delivered by the control circuit 18, with the result that the delay line discharges into the utilization circuit 19.

After this discharge, the delay line can then be recharged but it is important to ensure that this recharge takes place only when the thyristor 17 is cut-off since, if it were in the conducting state, the feed source 12 would be short-circuited.

In order to avoid faulty operation of this type, steps are taken to ensure that the thyristor 17 is released after discharge of the delay line. To this end, the equivalent impedance Ze of the utilization circuit 19 is chosen so as to be lower than the characteristic impedance Zc of the delay line (negative match), the impedance Zc being equal to $\sqrt{Le/Ce}$, where:
Le is the equivalent self-inductance of the coils L1, L2, . . . Lr and
Ce is the equivalent capacitance of the capacitors C1, C2 . . . Cr.

As a result of this choice of relative values of Zc and Ze, a negative voltage is brought to the terminals of the thyristor 17 after a time interval $\theta$ such that:

$$\theta = 2\sqrt{LeCe}$$

It is this negative voltage which turns-off the thyristor 17.

The diagram of FIG. 2 shows the time-dependent variation in voltage at the input terminal E of the delay line 11.

The diagram of FIG. 3 shows the time-dependent variation in voltage at the input terminal of the delay line when Ze is chosen so as to be higher than Zc, which corresponds to a so-called positive match. The thyristor 17 is not turned-off and this would result in a short-circuit of the feed source 12 if recharging of the delay line were permitted.

In order to prevent this faulty operation, it has been proposed to replace the diode 16 by a thyristor which would be triggered into conduction a certain time after the pulse which triggers the thyristor 17 but the choice of this time interval presupposes that the current flowing within the discharge circuit at this instant is lower in value than the thyristor turn-off current. This is not always the case, especially when the utilization circuit is an electron tube such that the impedance presented by said tube to the modulator can vary, for example as a function of the applied voltage, of its conditions of operation or at the time of an accidental short-circuit.

The object of the present invention is therefore to provide a device for protecting a delay-line modulator which prevents charging of the delay line as long as the thyristor for controlling the discharge is not turned-off.

SUMMARY OF THE INVENTION

The invention accordingly relates to a device for protecting a delay-line modulator, of the type comprising a first switch for charging the delay line and a second switch for discharging the delay line into the utilization circuit, said device being essentially constituted by first means for detecting the opening of the second switch and second means actuated by said first means for permitting closing of the first switch when it is ensured that opening of the second switch has been detected.

BRIEF DESCRIPTION OF THE DRAWINGS

FIG. 1 is a schematic circuit diagram of a delay-line modulator in accordance with the prior art.

FIGS. 2 and 3 are diagrams showing the curves of time-dependent variation of the voltage at the input terminal E of the delay line.

FIG. 4 is a diagram of a delay line modulator provided with a protection device in accordance with the invention.

DETAILED DESCRIPTION OF THE INVENTION

FIGS. 1 to 3 have been described in the introductory part of this specification with a view to showing the problems encountered in delay-line modulators of the prior art.

FIG. 4 is a diagram which shows a protection device in accordance with the invention, in addition to the elements of FIG. 1 which are designated by the same references.

The invention consists in preventing recharging of the delay line 11 as long as the voltage at the terminals of the line is higher than the threshold of turn-off of the thyristor 17. In order to control recharging of the line, use is made of a second thyristor 20 which replaces the diode 16 (FIG. 1) and which can be caused to conduct only when the voltage at the terminals of the delay line is lower than the threshold of turn-off of the thyristor 17.

The terminal voltage of the delay line is measured by means of a capacitive voltage-dividing bridge which comprises the capacitors 21 and 22. The common point or node of these two capacitors is connected to a first input terminal 25 of a comparator 23, the other input terminal 26 of which is connected to a threshold circuit 27, the output voltage of which is adjustable. The output voltage of the comparator 23 is connected to one input terminal of an AND logic circuit 24, the other input terminal of which is connected to the control circuit 18.

In addition to the pulse which triggers the thyristor 17 into conduction, the control circuit 18 delivers a pulse for triggering the thyristor 20. However, this last-mentioned pulse is not applied directly to the thyristor 20 as in the prior art but via the AND logic circuit 24 which is open only when, at the input of the comparator 23, the terminal voltage of the delay line becomes lower than a predetermined threshold value corresponding to the turn-off voltage of the thyristor 17.

The pulse for triggering the thyristor 20 is usually synchronized with the pulse for triggering the thyristor 17 so as to appear at a fixed time delay after this latter. If the thyristor 17 is not turned-off at the instant of appearance of said pulse, the comparator 23 will not have changed state, with the result that the AND logic circuit 24 will remain closed and that the recharging trigger pulse will not be applied to the thyristor 20. As long as the thyristor 17 is not turned-off, no trigger pulse will be applied to the thyristor 20 and it will not be possible for the feed source 12 to be short-circuited by the thyristor 17 which remains in the conducting state in this case.

In consequence, the circuit for overcurrent protection of the feed source 12 will not be activated since the modulator is still in the operative state. It will be possible to apply the following trigger pulse if the condition of turn-off of the thyristor 17 is satisfied. The operation of the modulator will resume normally. There will therefore not be any stoppage of the modulator and only one or possibly a few power pulses will be missing.

The protection device which has just been described can be designed in many alternative forms without thereby departing from the scope of the present invention. In particular, the thyristors 17 and 20 may generally consist of controlled switches. In addition, the voltage can be measured at the point E.

Another alternative embodiment would consist in monitoring the current which flows in the discharge circuit of the delay line.

What is claimed is:

1. A device for protecting a delay-line modulator, of the type including a first switch for charging the delay-line and a second switch for discharging the delay line into a utilization circuit, closing of the first and second switches being controlled by trigger pulses, said device comprising:

first means for providing an output signal when the output voltage of said delay-line is smaller than the conduction threshold of said second switch; and second means for permitting closing of said second switch when said first means provided said output signal.

2. A device for protecting a delay-line modulator according to claim 1, wherein said first means comprises a capacitor dividing means wherein the output terminal of said capacitor dividing means is connected to an input terminal of a comparator means.

3. A device for protecting a delay-line modulator according to claim 2, wherein said second means comprises a logic circuit which is opened by said output signal of said first means so as to permit onward transmission of said first switch controlling trigger pulse applied to said logic circuit.

* * * * *